United States Patent
Ishiyama

(10) Patent No.: US 7,320,097 B2
(45) Date of Patent: Jan. 15, 2008

(54) SERIAL TO PARALLEL CONVERSION CIRCUIT HAVING A SHIFT CLOCK FREQUENCY LOWER THAN A DATA TRANSFER FREQUENCY

(75) Inventor: Hiroshi Ishiyama, Tsuruoka (JP)

(73) Assignee: NEC Electronics Corporation, Kanagawa (JP)

( * ) Notice: Subject to any disclaimer, the term of this patent is extended or adjusted under 35 U.S.C. 154(b) by 298 days.

(21) Appl. No.: 11/066,191

(22) Filed: Feb. 25, 2005

(65) Prior Publication Data
US 2005/0206535 A1    Sep. 22, 2005

(30) Foreign Application Priority Data
Mar. 1, 2004   (JP) .............................. 2004-056132

(51) Int. Cl.
  *G01R 31/28*   (2006.01)
(52) U.S. Cl. ..................................... 714/726
(58) Field of Classification Search ................. 714/726
  See application file for complete search history.

(56) References Cited
U.S. PATENT DOCUMENTS
5,223,833 A * 6/1993 Akata ......................... 341/100
6,259,387 B1 * 7/2001 Fukazawa ................... 341/100
6,826,113 B2 * 11/2004 Ellis et al. .................. 365/233
7,170,325 B2 * 1/2007 Lee ............................ 327/172

FOREIGN PATENT DOCUMENTS

| JP | 4-38017 A | 2/1992 |
| JP | 7-7438 A | 1/1995 |
| JP | 7-147568 A | 6/1995 |
| JP | 10-232656 A | 9/1998 |
| JP | 10-322224 A | 12/1998 |
| JP | 11-112357 A | 4/1999 |
| JP | 2003-115194 A | 4/2003 |

* cited by examiner

*Primary Examiner*—James C. Kerveros
(74) *Attorney, Agent, or Firm*—Sughrue Mion, Pllc.

(57) ABSTRACT

A serial to parallel conversion circuit is provided. The circuit includes a shift register including flip-flops latch circuits, and control circuits. The flip-flops are connected in cascade, with a first stage flip-flop supplied with a transfer start signal that is sequentially transferred through the shift register, responsive to a shift clock signal. The latch circuits receive the output signals of the flip-flops, and latch and output a data signal, responsive to the output signals. The control circuits correspond to the flip-flops, and a first stage control circuit receives the shift clock signal and a start pulse and each remaining control circuit receives the shift clock signal and an output signal of a corresponding flip-flop. Each control circuit sets a state of a corresponding flip-flop to control a pulse width of an output signal. The frequency of said shift clock signal is set to lower than a data transfer frequency.

14 Claims, 8 Drawing Sheets

· SHIFT REGISTER OPERATED WITH RISING EDGE OF CLK

RESET WITH CLK="L" LEVEL FOR Q="H" LEVEL

· SHIFT REGISTER OPERATED WITH RISING EDGE OF CLK

RESET WITH CLK="H" LEVEL FOR Q="H" LEVEL

SERIAL TO PARALLEL CONVERSION CIRCUIT HAVING A SHIFT CLOCK FREQUENCY LOWER THAN A DATA TRANSFER FREQUENCY

FIELD OF THE INVENTION

This invention relates to a semiconductor device and, more particularly, to a serial to parallel conversion circuit.

BACKGROUND OF THE INVENTION

A semiconductor device is required to be driven with low voltage, low power dissipation and a high operating frequency. In particular, the semiconductor device, used for e.g. a mobile device, is required to be driven not only with low power dissipation but with a high operating speed in keeping up with increase in the amount of data to be processed.

However, these requirements are in a trade-off relationship to one another. That is, in case it is attempted to decrease the power dissipation, the operating speed is lowered, whereas, in case it is attempted to improve the operating speed, the power dissipation is increased.

FIG. 7 is a diagram illustrating a typical example of a conventional serial to parallel conversion circuit. Referring to FIG. 7, this conventional circuit is described. In this figure, plural (herein n) flip-flops FF1 to FFn, connected in cascade, are D flip-flops (edge-triggered flip-flops), each having a resetting function, and compose a shift register, whilst plural (herein n) latches LT1 to LTn are D latches (level-sensitive latches), forming a data register. These n latches LT1 to LTn are supplied at clock input terminals C thereof with data sampling signals S1 to Sn, output from data output terminals Q of the flip-flops FF1 to FFn, forming the shift register, respectively, while receiving data D0n, output from a control block CONT, at data input terminals D thereof, and sampling the so received data, to output the so sampled data in parallel at the data output terminals Q as outputs O1 to On. Meanwhile, the data signal D0n, output from the control block CONT, is of a k-bit width, where k is a positive integer not less than 1. In case k is not less than 2, the latch LT1, supplied with k-bit data in parallel, is formed by a set of k latches. The control block CONT is supplied with a data transfer start pulse STP, a data input Dn (k bits), a transfer clock signal CLK and a reset signal RES to output a data transfer start pulse STPO, a shift clock CLKO and a data output DnO in synchronism with the shift clock CLK.

When supplied with the data transfer start pulse STP, the shift register (FF1 to FFn) is activated by the shift clock signal CLKO to generate respective data sampling signals S1 to Sn. The data signal Dn, entered in synchronization with the data transfer start pulse STP, is sampled and output by the data registers LT1 to LTn, by the respective data sampling signals S1 to Sn, generated by the shift register.

FIG. 8 illustrates the operating timing of the circuit shown in FIG. 7. Referring to FIG. 8, the operation of the circuit shown in FIG. 7 is explained. The D flip-flop FF1, forming the shift register, samples a high level output of the data transfer start pulse STPO with the falling edge of the clock CLKO to output a high level data sampling signal S1, while sampling a low level output thereof with the falling edge of the clock signal CLKO to output the low level data sampling signal S1. As from this time, the data transfer start pulse STPO is transferred in the second and the following stages of the shift register, that is, the flip-flops FF2 to FFn.

In the D latch LT1, during the high level period of the data sampling signal S1, the data input to a data input terminal D is passed to the data output terminal, as it is. When the data sampling signal S1 undertakes a transition from a high level to a low level, the D latch LT1 holds and outputs the data directly before the transition. By the above processing, serial data D11 to D1n are output from latch outputs O1 to On in parallel.

Referring to FIG. 8, the maximum operating frequency of the circuit shown in FIG. 7 is the frequency of the shift clock signal CLKO fed to the shift register (FF1 to FFn) which generates data sampling signals S1 to Sn, and the frequency of the clock line for propagating the shift clock signal is the transfer frequency (transfer rate) of the data signal Dn on a data line. It is noted that, in case the transfer of the data signal on the data line is to be effected using both the rising and falling edges of the transfer clock (double data rate), the frequency of the shift clock signal CLKO is twice the transfer clock signal on the data line.

If a signal line in need of an operating speed in excess of the targeted operation is used in a circuit intrinsically aimed to transfer the data, the result is the lowered maximum operating frequency of the circuit and the increased power dissipation.

In particular, in a serial to parallel conversion circuit, targeted at data transfer, the length of the signal line and the load of the line are increased. In such case, a signal line having a high operating speed, such as a clock line of FIG. 7, is deterrent to decreasing the driving voltage, operating frequency and the power dissipation.

As a shift register of low power dissipation, there is known a configuration in which storage circuits are connected in series, the gate circuits in odd-numbered storage circuits are turned on with the high level of the clock signals, the gate circuits in the even-numbered storage circuits are turned on with the low level of the clock signals, and the data entered are latched in case the gate circuits are turned off, and the data are subsequently output, with the operation of the shift register taking place every one-half period of the clock period, thereby enabling the frequency of the clock signals to be halved (for example, see Patent Document 1).

There has also been known a configuration in which the operating frequency of the shift register is designed to be one-half the input frequency, and in which the shift register is operated at the so halved frequency to reduce the power dissipation and the noise (for example, see Patent Document 2).

[Patent Document 1]
JP Patent Kokai Publication No. JP-P2003-115194A (pages 4 to 5, FIG. 1).

[Patent Document 2]
JP Patent Kokai Publication No. JP-A-10-232656 (pages 3 and 4 and FIG. 1).

SUMMARY OF THE DISCLOSURE

The present inventors have conducted perseverant researches into the configuration which is compromised between the low power dissipation and the high speed operation and have devised a configuration totally different from the configuration disclosed in the above Patent Documents 1 and 2.

Accordingly, it is therefore an object of the present invention to provide a semiconductor circuit of a novel configuration designed to achieve the low power dissipation and a high speed operation.

The above and other objects are attained by the present invention in which the frequency of the shift clock signal of the shift register, which generates data strobe clock signals, is divided to one half the frequency of the input clock signal, so that the clock signal will operate at one-half the transfer frequency of a data signal.

A serial to parallel conversion circuit in accordance with one aspect of the present invention, includes a shift register including a plurality of flip-flops, connected in cascade, with a first stage flip-flop being supplied with a transfer start signal which is sequentially transferred responsive to a shift clock signal entered, a plurality of latch circuits, receiving respective output signals of the plural flip-flops, as respective data sampling signals, for latching a data signal, serially supplied to a data line, responsive to the data sampling signals, and a plurality of control circuits provided in association with the plural flip-flops, each control circuit receiving at least the shift clock signal and an output signal of the flip-flop associated therewith, each control circuit setting the state of the associated flip-flop, if, in case the output signal of the flip-flop associated therewith is in an active state, the shift clock is changed from an active state to an inactive state, so that an output signal thereof is in an inactive state, to control the pulse width of the output signal. The frequency of the shift clock signal is set so as to be lower than the data transfer frequency.

A serial to parallel conversion circuit in accordance with another aspect of the present invention includes a shift register including a plurality of flip-flops, a data input terminal of the first stage flip-flop being supplied with a transfer start pulse signal for controlling the start of the transfer, data input terminals of the second and the following stage flip-flops being supplied with output signals of respective preceding stage flip-flops, the shift register sequentially transferring the transfer start pulse signal responsive to shift clock signal entered common to clock terminals of the plural flip-flops from a clock line. The serial to parallel conversion circuit further includes a plurality of latch circuits receiving pulse signals, sequentially output from output terminals of the plural flip-flops, as data sampling signal, the latch circuits having data input terminals connected in common to the data line, the latch circuits latching and outputting a data signal serially transmitted on the data line, responsive to the associated data sampling signal. Neighboring ones of the flip-flops, out of the plural flip-flops of the shift register, sample and output signals entered to the data input terminals, respectively using one and the other of rising and falling edges of the shift clock signal supplied from the clock line. The serial to parallel conversion circuit further includes a plurality of control circuits provided upstream of the flip-flops for receiving at least the shift clock signal supplied to the flip-flops and output signals of the flip-flops. Each of the control circuits resets the flip-flop to inactivate an output signal of the flip-flop to control the pulse width of the output signal, when, in case the output signal is in an active state, the shift clock supplied to the flip-flop undertakes a transition to an inactive state. The frequency of the shift clock signal is set so as to be lower than the data transfer frequency.

According to the present invention, the control circuit includes a circuit for generating clock signal supplied to clock input terminals of the flip-flops, responsive to transition to an activated state of the shift clock, based on the data signal supplied to a data input terminal of the flip-flop being controlled, an output signal of the flip-flop and on the shift clock, and a circuit receiving an output signal of the flip-flop, the shift clock and a reset signal controlling the resetting of the shift register. The circuit generates a signal for resetting the flip-flop in case the reset signal is in an active state and in case the reset signal is in an inactive state but the output signal of the flip-flop is in an active state, with the shift clock signal being in an inactive state.

According to the present invention, there may be provided a frequency dividing circuit supplied with data transferring clock signal, as input, to generate signals corresponding to frequency divided clock signal, corrected for phase. The frequency divided clock signal are obtained on frequency dividing the data transferring clock signal. There may further be provided a control block receiving a pulse signal for starting the transfer, outputting the transfer start pulse signal, as supplied, to the data input terminal of the first stage flip-flop of the shift register. The block sequentially outputs the input a data signal responsive to the data transfer clock signal.

The meritorious effects of the present invention are summarized as follows.

According to the present invention, the operating frequency of the circuit may be improved, whilst the low voltage driving and low power dissipation may be achieved, by lowering the operating frequency of the clock line of the shift register.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
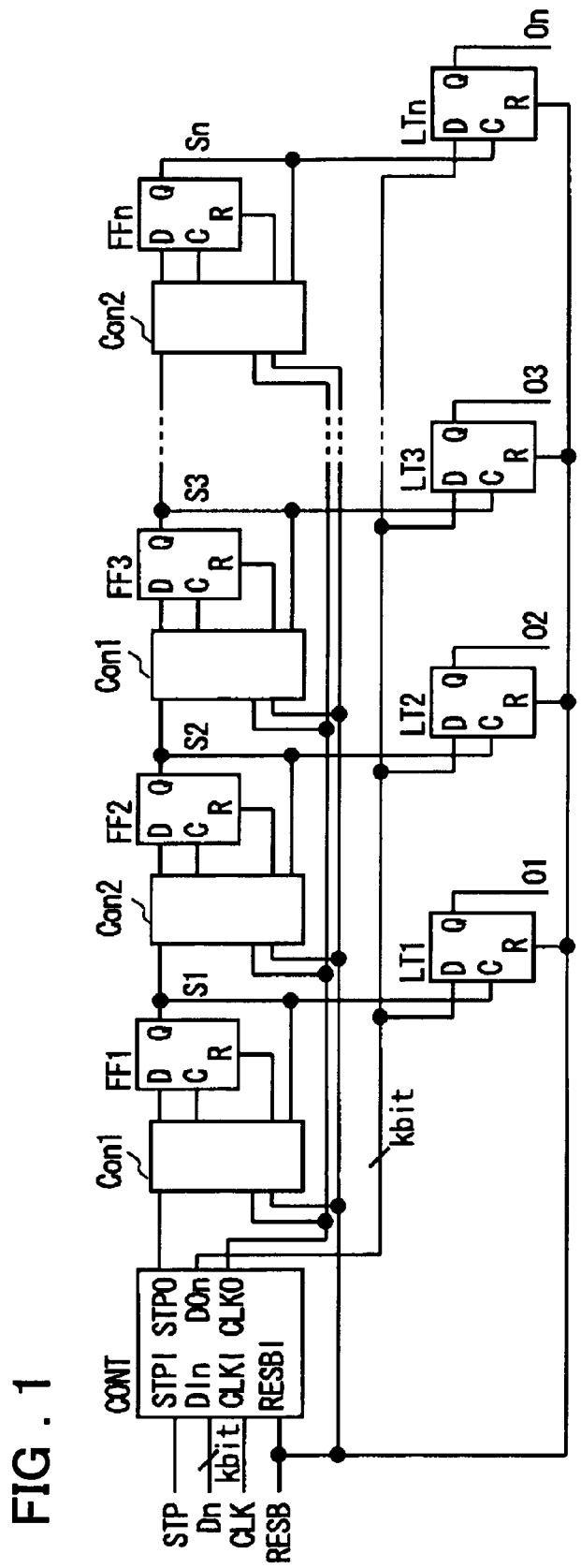
FIG. 1 is a diagram showing a circuit configuration of an embodiment of the present invention.

For more detailed explanation of the present invention, preferred embodiments of the present invention are explained in detail by referring to the drawings.

Figure 7:
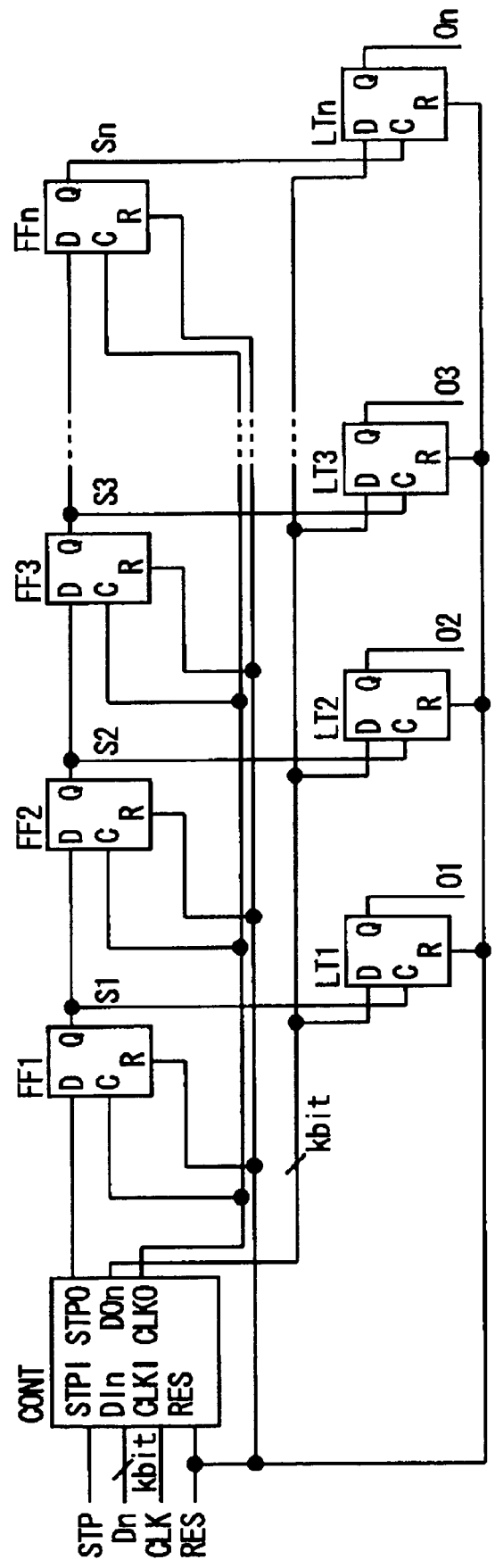
FIG. 7 is an example of a typical configuration of a conventional serial to parallel conversion circuit.
Figure 8:
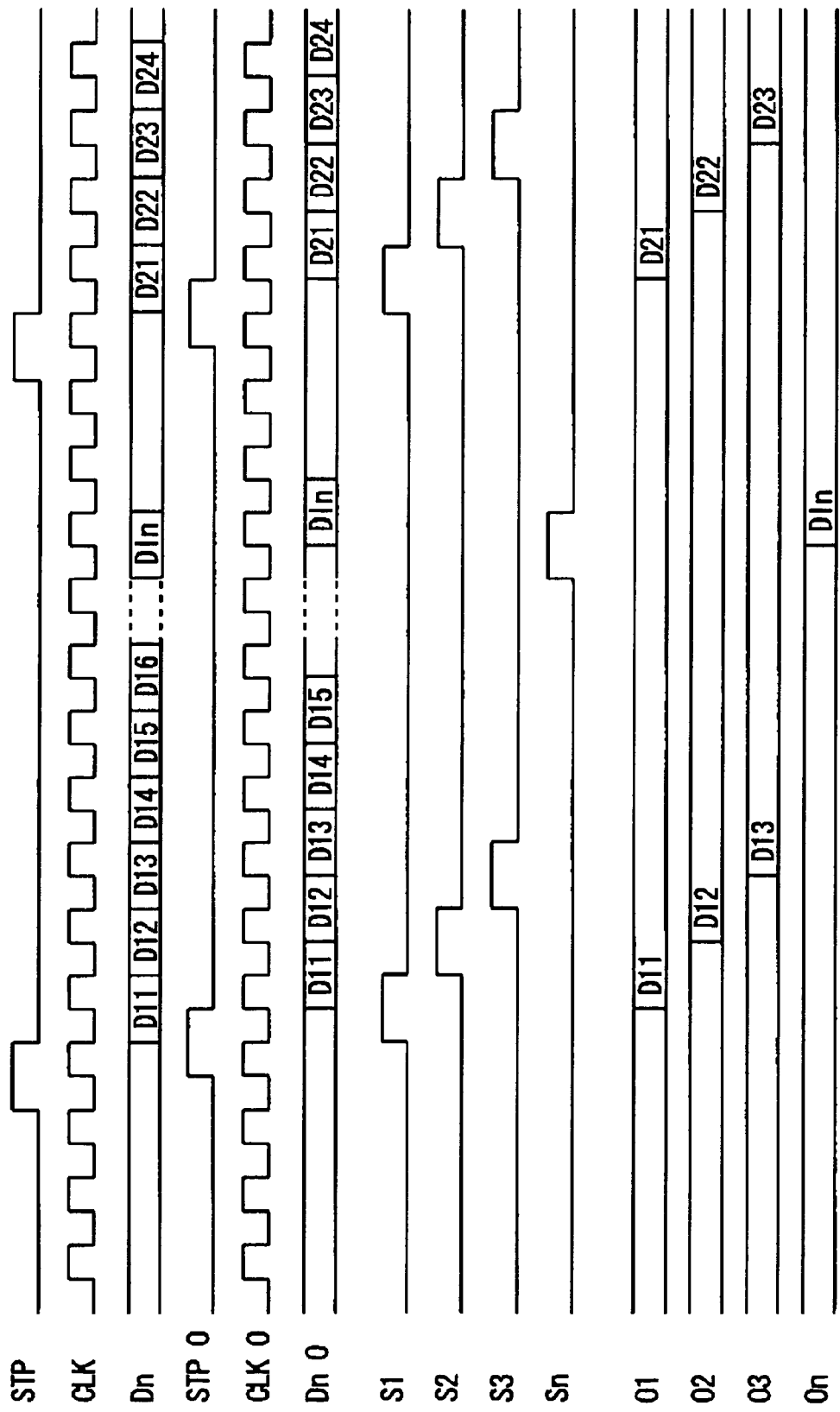
FIG. 8 is a timing chart showing an example of the operation of the circuit of FIG. 7.

FIG. 1 is a diagram showing the configuration of a preferred embodiment for carrying out the present invention. Referring to FIG. 1, a serial to parallel conversion circuit according to the present embodiment, as contrasted to the conventional configuration shown in FIG. 7, includes a circuit for controlling the clock signal supplied to plural D flip-flops FF1 to FFn, making up a shift register, within a control block CONT, while also including a first control circuit Con1 and a second control circuit Con2 for controlling the shift register (FF1 to FFn). The flip-flops FF1 to FFn receive data output signals, a clock signal and a reset signal from a relevant one of the first control circuit Con1 and the second control circuit Con2, at data input terminals Q, clock input terminals C and at reset terminals R thereof, respectively, to provide output signals S1 to Sn from respective data output terminals Q to clock input terminals C of respective D latches LT1 to LTn and to the relevant control circuits. The D latches LT1 to LTn are responsive to respective output signals S1 to Sn (data sampling signals) of the flip-flops FF1 to FFn to latch a data signal transferred on the data line to output the so latched signals from the respective output terminal Q as parallel signals O1 to On. In FIG. 1, the data signal Don, output from the control block CONT, is of a k-bit width, where k denotes a positive integer not less than 1. In case k is not less than 2, k of D latches, supplied with k-bit data in parallel, make up one set. Similarly, k of latches LT2, . . . LTn form one set.

By way of clock control for the shift register (FF1 to FFn), a frequency divider, not shown, provided in the control block CONT, frequency-divides the transfer clock signal CLK, entered to the control block CONT, by two, to generate a clock signal CLKO, also termed a shift clock signal. The control block CONT performs phase correction of the clock signal CLKO, which is fed to the shift register (FF1 to FFn), at the time of inputting the data transfer start pulse STP. Specifically the frequency divider, not shown, for frequency dividing the transfer clock signal CLK by two, is set so that the frequency-divided clock signal CLKO will start from a high level at the time of inputting the data transfer start pulse STP.

The first control circuits Con1 are supplied with output signals of the data output terminals Q of the D flip-flops, controlled by the first control circuits Con1, such as D flip-flops FF1, FF3, . . . . In case the output terminal Q of the D flip-flop is in an active state, the first control circuit Con1 sets the reset signal of the D flip-flop active at the time of the inputting of the shift clock CLKO which is in the inactive level to initialize the D flip-flop. The output terminal Q of the D flip-flop, thus reset, is set to a non-active state.

The second control circuits Con2 are supplied with output signals of the data output terminals Q of the D flip-flops, controlled by the second control circuits Con2, such as D flip-flops FF2, FF4, . . . . In case the output terminal Q of the D flip-flop is in an active state, the second control circuit Con2 sets the reset signal of the D flip-flop active at the time of the inputting of the shift clock CLKO which is in the inactive level to initialize the D flip-flop.

In an embodiment of the present invention, it is possible to lower the operating frequency of the clock line of the shift register (FF1 to FFn) to improve the operating frequency of the circuitry to achieve the low power dissipation. Moreover, low voltage driving becomes possible by lowering the operating frequency of the clock line. In the following, specified examples of the configuration of the first and second control circuits Con1 and Con2 are described in detail.

EMBODIMENTS

Figure 2A:
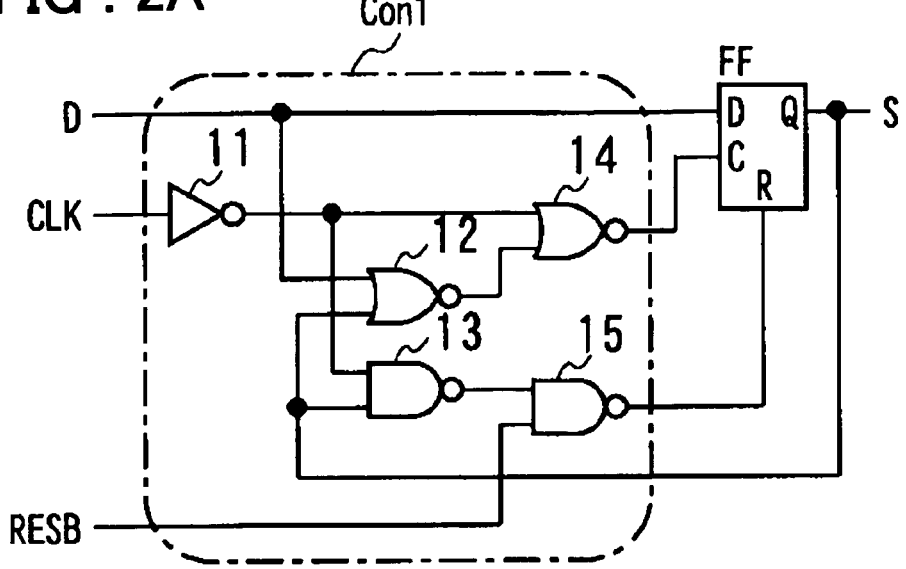
FIGS. 2A and 2B are diagrams showing an illustrative configuration of control circuits Con1 and Con2 according to an embodiment of the present invention.
Figure 2B:
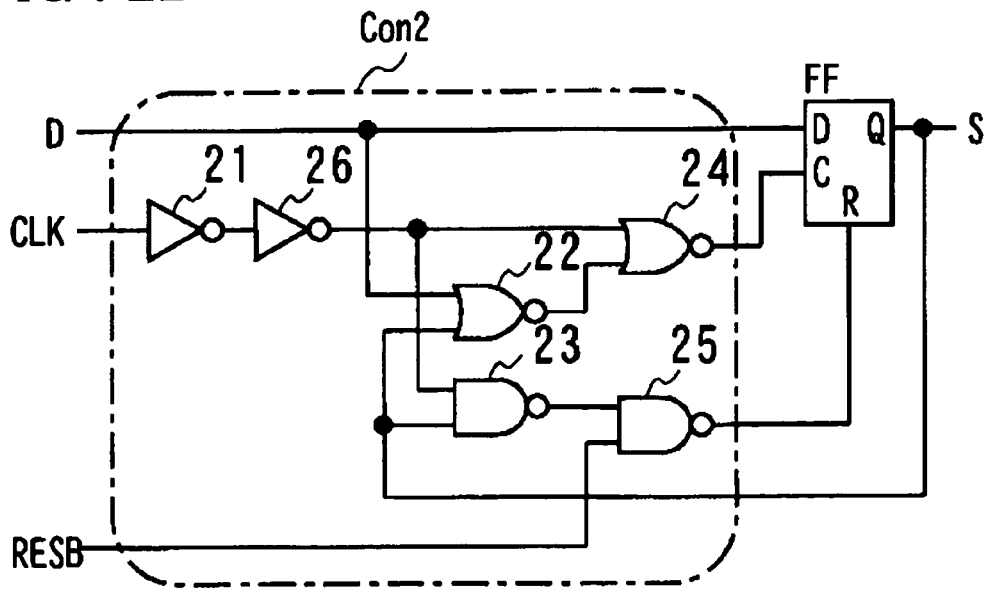

FIGS. 2A and 2B illustrate the circuit configuration of the first control circuit Con1 and the second control circuit Con2 of FIG. 1, respectively. First, the first control circuit Con1 is explained. Referring to FIG. 2A, the first control circuit Con1 includes an inverter 11 for inverting the clock signal entered to the clock input terminal CLK, a NOR circuit 12, supplied with a signal from a data input terminal D and with an output signal of the output terminal Q of the D flip-flop FF, and a NAND circuit 13, supplied with an output signal of the inverter 11 and an output signal of the output terminal Q of the D flip-flop. The first control circuit Con1 also includes a NOR circuit 14, supplied with an output signal of the inverter 11 and with an output signal of the NOR circuit 12, and a NAND circuit 15, supplied with an output signal of the NAND circuit 13 and a reset signal RESB. The signal from the data input terminal D is entered to the data input terminal D of the D flip-flop FF being controlled, and an output signal of the NOR circuit 14 is entered to the clock input terminal C of the D flip-flop FF, whilst an output signal of the NAND circuit 15 is entered to the reset input terminal R of the D flip-flop FF. Meanwhile, in the example shown in FIG. 1, the first control circuit Con1, supplied with an output of the control block CONT, has its data input terminal D supplied with the data transfer start pulses STPO, while having its clock input terminal C supplied with the shift clock CLKO from the clock line and receiving the output signal Q of the D flip-flop FF1 (output signal S1) fed back thereto. The second control circuit Con2, supplied with an output S2 of the D flip-flop FF2, has its data input terminal D supplied with the signal S2, while having its clock input terminal C with the shift clock CLKO from the clock line, and receiving the output signal Q of the D flip-flop FF1 (output signal S2) fed back thereto.

When the reset signal RESB is low, such as during initializing of the shift register, the D flip-flop FF is reset. In the following, it is assumed that the reset signal RESB is at a high level.

If, in FIG. 2A, the data input terminal D is at a high level, the output signal Q of the D flip-flop FF is at a low level, the clock signal CLK undergoes a transition from a low level to a high level, the output of the inverter 11 goes low, the output of the NOR circuit 12 goes low and the output of the NOR circuit 14, both inputs of which are low, goes high. The D flip-flop FF samples the level of the data input terminal D with an edge of transition from a low level to a high level at the clock input terminal, with the output signal of the D flip-flop FF going high. If, in this state, the clock signal CLK transfers from the high level to the low level, both inputs of the NAND circuit 13 transfer to a high level, so that its output goes low and the output of the NAND circuit 15 transfers from a low level to a high level. The D flip-flop FF, to the reset terminal R of which is supplied an output of the NAND circuit 15, is reset, so that the output terminal Q thereof goes low. If, with the output of the NOR circuit 12 at a low level, the clock signal CLK transfers from the low level to the high level, the D flip-flop FF samples and outputs the signal at the data input terminal D. Meanwhile, in case the output signal Q of the D flip-flop FF is at a low level and data entered to the data input terminal D is at a low level, the output of the NOR circuit 12 is at a high level, such that the output of the NOR circuit 14, supplied with an inverted version of the shift clock, is set to a low level. That is, in case the output signal Q of the D flip-flop FF is low, that is, remains unchanged, no clock signal are supplied to the D flip-flop FF.

Figure 3A:
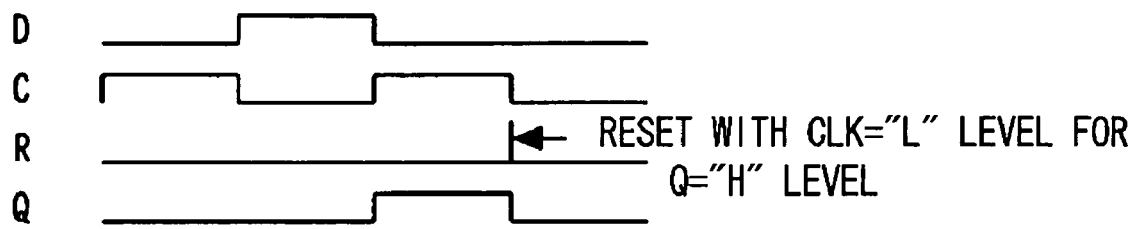
FIGS. 3A and 3B are timing charts showing an example of the operation of a control circuit according to an embodiment of the present invention.

FIG. 3A illustrates the operation of the control circuit Con1, shown in FIG. 2A, and that of the D flip-flop thereby controlled. The high level of the data signal, entered to the data input terminal D of the D flip-flop FF, is sampled by the rising edge at the clock signal input terminal C, with the output terminal Q going high. At this time, the reset terminal R of the D flip-flop FF goes high with the transition from the high level to the low level of the clock signal input terminal C and the D flip-flop FF is reset, with its output signal Q going low.

The control circuit Con2 is now described. Referring to FIG. 2B, the control circuit Con2 is the same as the configuration shown in FIG. 2A, except that there is provided in the control circuit Con2 an inverter 26 for further inverting the output of the inverter 21 designed to invert the signal entered to the clock input terminal CLK. The control circuit Con2 samples the signal entered to the data input terminal D with the falling edge from a high level to a low level at the clock input terminal CLK. When the output signal Q of the D flip-flop FF is high and the level at the clock input terminal CLK is high, the output of the NAND circuit 13 goes low, so that the reset terminal R of the D flip-flop FF goes high through a NAND circuit 25 to reset the D flip-flop FF.

Figure 3B:
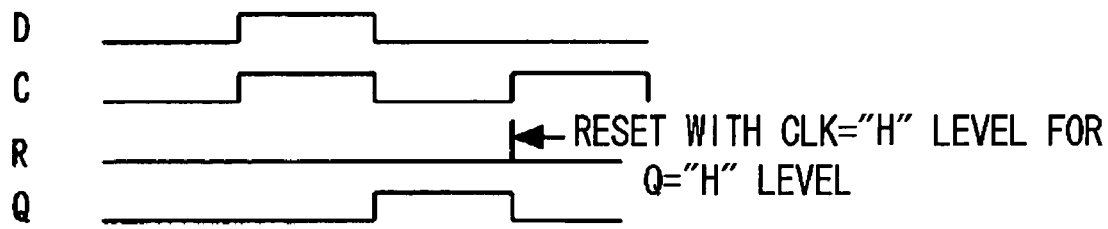

FIG. 3B illustrates the operation of the control circuits Con2 and the D flip-flop thereby controlled. The high level of the data entered to the data input terminal D of the D flip-flop FF is sampled by the falling edge of the clock input terminal C so that its output terminal Q goes high. At this time, the reset terminal R of the D flip-flop goes high with the transition to a high level of the clock input terminal C, with the output signal Q thereof going low.

Figure 4:
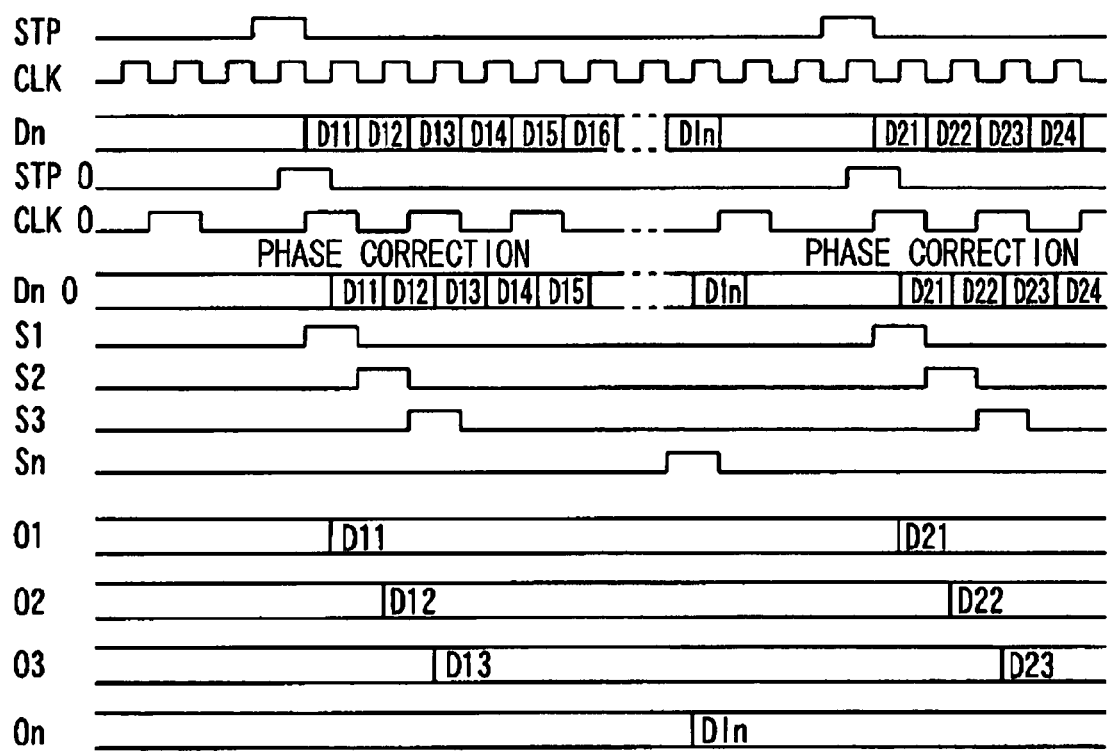
FIG. 4 is a timing chart showing an example of the operation of the present invention.

FIG. 4 is a timing diagram showing the operation of the present embodiment as shown in FIG. 1. When the data transfer start pulse STP is entered to the control block CONT, a divide-by-2 frequency divider, nor shown, provided within the control block CONT, is initialized to correct the phase of the shift clock signal CLKO to be supplied to the shift register (FF1 to FFn).

The shift clock signal CLKO, having the frequency divided by two, are supplied from the clock line through the control circuits Con1 and Con2 in the shift register to the flip-flops FF1 to FFn to shift data. The flip-flops FF1 to FFn generate and output the respective data sampling signals S1 to Sn at the output terminals Q thereof.

The pulse widths of the respective output signals S1 to Sn of the flip-flops FF1 to FFn, making up the shift register, are controlled by reset signals generated by the control circuits Con1 and Cn2.

The data signal Dn, which is entered with a timing matched with the data transfer start pulse STP, are sampled by the data registers LT1 to LTn with the respective data sampling signals S1 to Sn, generated by the shift register (FF1 to FFn).

In the present embodiment, the frequency of the shift clock signal CLKO of the shift register (FF1 to FFn) is one-half the data transfer frequency (frequency of the clock signal CLK), so that the maximum operating frequency is lowered. Hence, the operating speed of the circuitry may be increased to enable the driving at a lower voltage. Moreover, the power dissipation may be reduced by lowering the operational rate of the clock line of the shift register.

Figure 5:
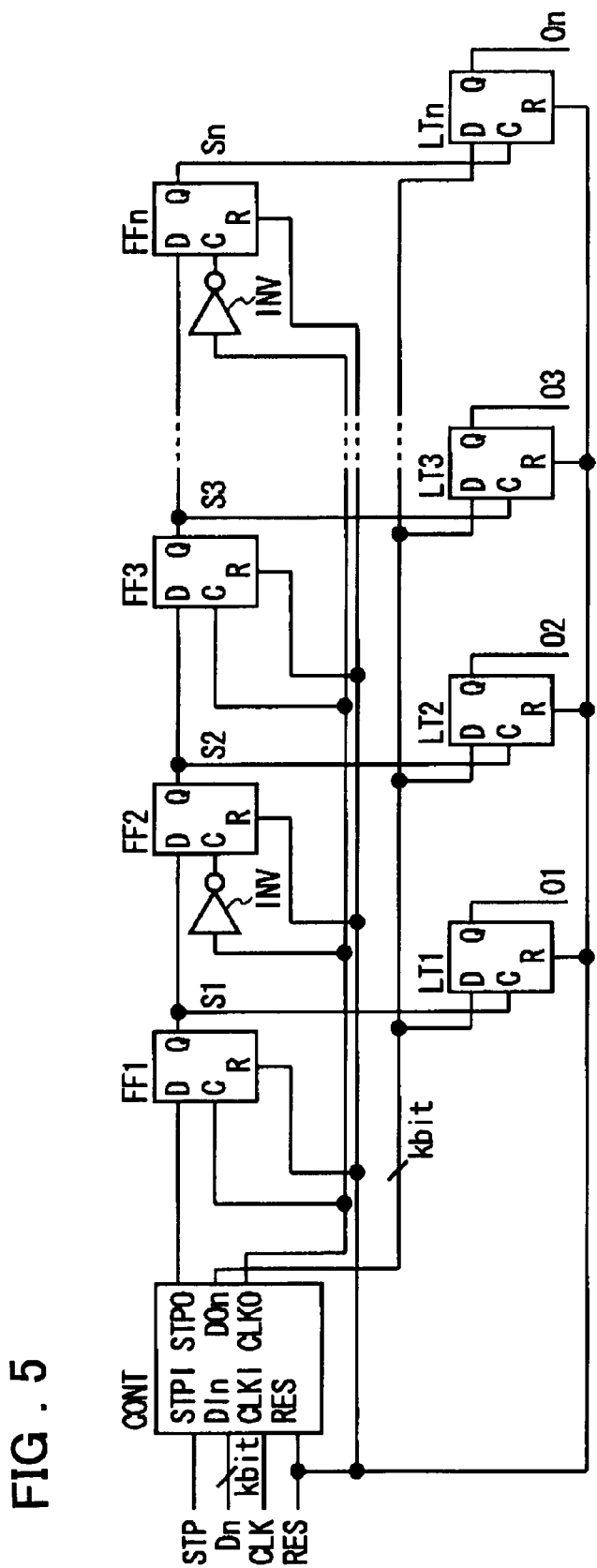
FIG. 5 is a diagram showing a circuit configuration of a modification of the present invention.

A second embodiment of the present invention is now described. FIG. 5 is a diagram showing the configuration of the second embodiment of the present invention.

Referring to FIG. 5, in the second embodiment of the present invention, the data latches LT1 to LTn are composed by D flip-flops, and the control circuits Con1 and Con2, performing pulse control of the shift register (FF1 to FFn), are changed to inverters INV for adjusting the active levels of the clock input terminals C of the shift register (FF1 to FFn). The D flip-flop FF1 samples the signal of the data input terminals D with the rising edges of shift clock signal at the clock input terminals CLKO, while the D flip-flop FF2 samples the signal of the data input terminals D with the falling edges of the shift clock signal at the clock input terminals CLKO.

In case the D flip-flops are used as data latches, the chip area is increased depending on the number of bits in the data. However, the data take-in timing is facilitated, because of characteristics of the D flip-flops, thus increasing the operating speed.

Figure 6:
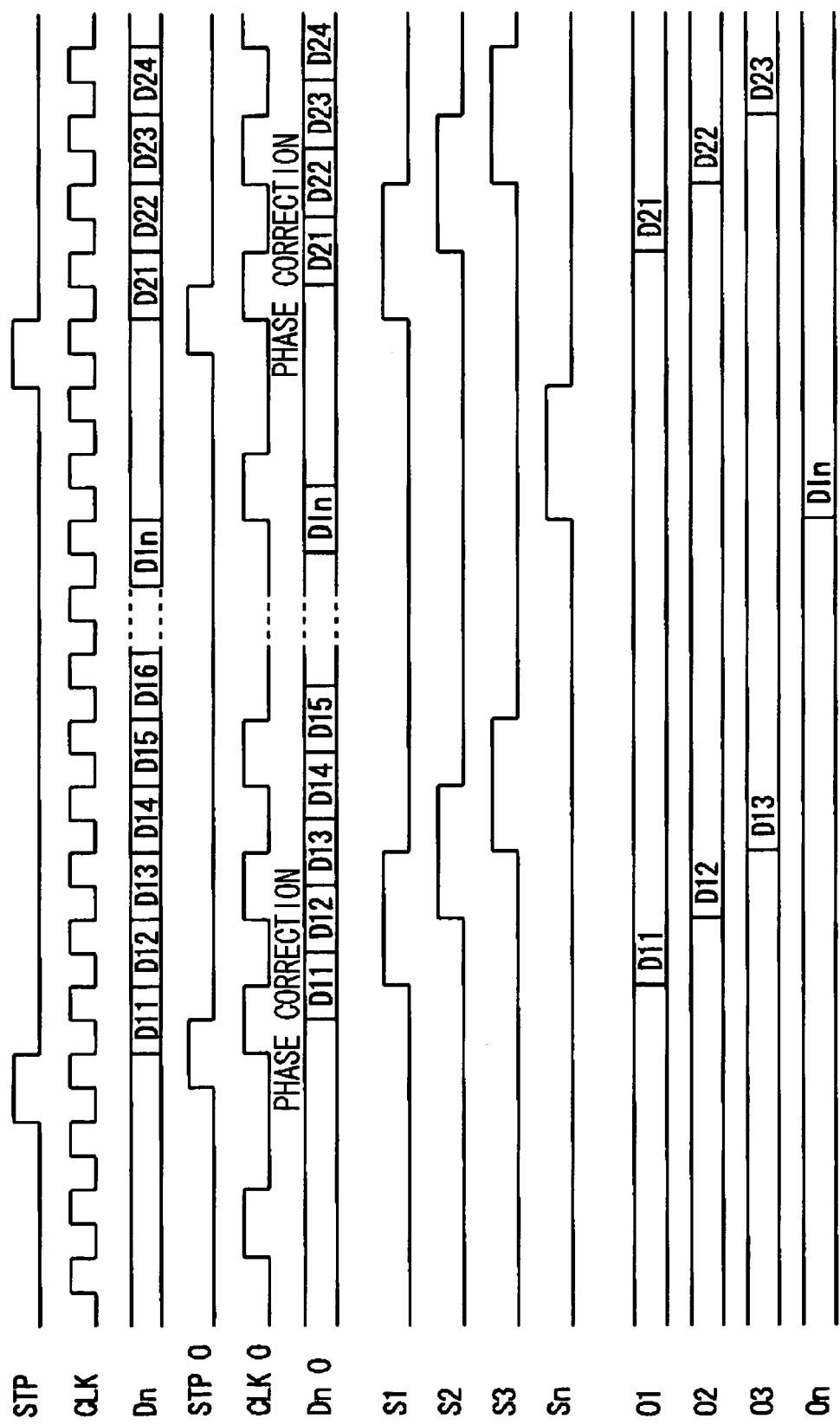
FIG. 6 is a timing chart showing an example of the operation of the present modification.

FIG. 6 illustrates an example of the timing operation of the second embodiment of the present invention.

Referring to FIG. 6, when the data transfer start pulses STP is entered, the divide-by-two frequency divider in the control block CONT is initialized, and the phase of the clock signal CLKO of the shift register (FF1 to FFn) is corrected. That is, the clock signals CLKO are started from the high level.

By the shift clock signal CLKO, divided in two in frequency, shifts data to generate the data sampling signals S1 to Sn.

The active level of the clock signal of the shift register (FF1 to FFn) is guaranteed by the inverters INV. The data Dn, which is entered with a timing matched with the data transfer start pulse STP, are taken in by the data registers LT1 to LTn by the data sampling signals S1 to Sn, generated by the shift register (FF1 to FFn).

As described above, the present embodiment enables low voltage driving, low power dissipation and high operating frequency to be realized and may conveniently be applied to, for example, a semiconductor device loaded on a mobile communication apparatus.

Although the present invention has been explained in the foregoing with reference to the above-described embodiments, it is to be noted that the present invention is not limited to the above-described embodiments such that various changes or corrections that may readily occur to those skilled in the art are comprised within the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A serial to parallel conversion circuit comprising:
   a shift register including a plurality of flip-flops, connected in cascade, with a first stage flip-flop being supplied with a transfer start signal, said transfer start signal being sequentially transferred through said shift register, responsive to a shift clock signal;
   a plurality of latch circuits, receiving respective output signals of said plurality of flip-flops, each of said latch circuits latching and outputting a data signal, serially supplied to a data line, responsive to the respective output signals; and
   a plurality of control circuits corresponding to said plurality of flip-flops, a first stage control circuit of the plurality of control circuits receiving at least said shift clock signal and a start pulse and each remaining control circuit of the plurality of control circuits receiving at least said shift clock signal and an output signal of a corresponding upstream flip-flop, each of said control circuits setting a state of a corresponding downstream flip-flop, when, in case the output signal of a corresponding downstream flip-flop is in an active state, said shift clock signal undertakes a transition from an active state to an inactive state, so that an output signal of the corresponding downstream flip-flop is in an inactive state, to control a pulse width of said output signal;

wherein a frequency of said shift clock signal is set to lower than a data transfer frequency.

2. The serial to parallel conversion circuit according to claim 1, wherein each of said plurality of control circuits comprises:

a circuit for generating a clock signal supplied to a clock input terminal of a corresponding downstream flip-flop, responsive to a transition to an activated state of said shift clock signal, based on a data signal supplied to a data input terminal of said corresponding downstream flip-flop, on an output signal of said corresponding downstream flip-flop, and on said shift clock signal; and a circuit for generating a signal for resetting said corresponding downstream flip-flop based on an output signal of said corresponding downstream flip-flop, on said shift clock signal, and on a reset signal which control a resetting of said shift register; wherein said circuit for generating the signal for resetting said corresponding downstream flip-flop resets said corresponding downstream flip-flop in a case where said reset signal is in an active state, and in a case where said reset signal is in an inactive state, the output signal of said corresponding downstream flip-flop is in an active state and said shift clock signal is in an inactive state.

3. The serial to parallel conversion circuit according to claim 2, further comprising:

a frequency dividing circuit, which receives a data transfer clock signal and frequency divides said data transfer clock signal to generate a frequency divided clock signal having a corrected phase.

4. The serial to parallel conversion circuit according to claim 1, wherein each of said plurality of latch circuits is a D latch or an edge triggered D flip-flop.

5. A semiconductor device comprising the serial to parallel conversion circuit as defined in claim 1.

6. A serial to parallel conversion circuit comprising:

a shift register including a plurality of flip-flops, a data input terminal of a first stage flip-flop being supplied with a transfer start pulse signal for controlling a start of a data transfer, data input terminals of remaining stage flip-flops of the plurality of flip-flops being supplied with output signals of respective preceding stage flip-flops, said shift register sequentially transferring said transfer start pulse responsive to a shift clock signal common to clock terminals of said plurality of flip-flops from a clock line;

a plurality of latch circuits, receiving pulse signals sequentially output from output terminals of said plurality of flip-flops, said latch circuits having data input terminals connected in common to a data line, each of said latch circuits latching and outputting a data signal serially transmitted on said data line, responsive to said pulse signals;

neighboring flip-flops of said plurality of flip-flops sampling and outputting signals input to respective data input terminals of the neighboring flip-flops, rising and falling edges, respectively, of the shift clock signal supplied from said clock line; and a plurality of control circuits provided upstream of respective flip-flops of said plurality of flip-flops, a first stage control circuit of the plurality of control circuits for receiving at least the shift clock signal and the transfer start pulse signal and each remaining control circuit of the plurality of control circuits for receiving at least the shift clock signal and an output signal of a corresponding upstream flip-flop, each of said control circuits resetting a corresponding downstream flip-flop to inactivate an output signal of said corresponding downstream flip-flop to control a pulse width of said output signal, when, in case the output signal of said corresponding downstream flip-flop is in an active state, the shift clock signal supplied to said corresponding downstream flip-flop undertakes a transition from an active state to an inactive state;

wherein a frequency of said shift clock signal is set to lower than a data transfer frequency.

7. The serial to parallel conversion circuit according to claim 6, wherein each of said plurality of control circuits comprises:

a circuit for generating a clock signal supplied to a clock input terminal of a corresponding downstream flip-flop, responsive to a transition to an activated state of said shift clock signal, based on a data signal supplied to a data input terminal of said corresponding downstream flip-flop, on an output signal of said corresponding downstream flip-flop, and on said shift clock signal; and a circuit for generating a signal for resetting said corresponding downstream flip-flop based on an output signal of said corresponding downstream flip-flop, on said shift clock signal, and on a reset signal which controls a resetting of said shift register; wherein said circuit for generating the signal for resetting said corresponding downstream flip-flop resets said corresponding downstream flip-flop in a case where said reset signal is in an active state, and in a case where said reset signal is in an inactive state, the output signal of said corresponding downstream flip-flop is in an active state and said shift clock signal is in an inactive state.

8. The serial to parallel conversion circuit according to claim 7, further comprising:

a frequency dividing circuit, which receives a data transfer clock signal and frequency divides said data transfer clock signal to generate, a frequency divided clock signal having a corrected phase.

9. The serial to parallel conversion circuit according to claim 6, further comprising:

a frequency dividing circuit, which receives a data transfer clock signal and frequency divides said data transfer clock signal to generate a frequency divided clock signal having a corrected phase.

10. The serial to parallel conversion circuit according to claim 9, further comprising:

a circuit which receives data and a pulse signal for starting the data transfer and outputs said transfer start pulse signal to the data input terminal of the first stage flip-flop of said shift register and outputs sequentially said data to said data line responsive to said data transfer clock signal.

11. The serial to parallel conversion circuit according to claim 6, wherein each of said plurality of latch circuits is a D latch or an edge triggered D flip-flop.

12. A serial to parallel conversion circuit comprising:

a shift register including a plurality of flip-flops, a data input terminal of a first stage flip-flop of the plurality of flip-flops being supplied with a transfer start pulse signal for controlling a start of a data transfer, data input terminals of a second stage flip-flop and following stage flip-flops of the plurality of flip-flops being supplied with output signals of respective preceding stage flip-flops, said shift register sequentially transferring said transfer start pulse signal responsive to a shift clock signal to clock terminals of said plurality of flip-flops from a clock line; and a plurality of latch circuits receiving pulse signals, sequentially output from output terminals of said plurality of flip-flops, said latch circuits having data input terminals connected in common to a data line, each of said latch circuits latching and outputting a data signal, responsive to the pulse signals;

neighboring flip-flops of said plurality of flip-flops sampling and outputting signals input to respective data input terminals of the neighboring flip-flops, on rising and falling edges, respectively, of the shift clock signal supplied from said clock line;

wherein a frequency of said shift clock signal is set lower than a data transfer frequency.

13. The serial to parallel conversion circuit according to claim 12, further comprising:

a frequency dividing circuit, which receives a data transfer clock signal and frequency divides said data transfer clock signal to generate a frequency divided clock signal having a corrected phase.

14. The serial to parallel conversion circuit according to claim 12, wherein each of said plurality of latch circuits is a D latch or an edge triggered D flip-flop.

* * * * *